(12) United States Patent
Deckers

(10) Patent No.: US 11,056,629 B2
(45) Date of Patent: Jul. 6, 2021

(54) MOUNTING AN LED ELEMENT ON A FLAT CARRIER

(71) Applicant: Lumileds LLC, San Jose, CA (US)

(72) Inventor: Michael Deckers, Jülich (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/496,160

(22) PCT Filed: Mar. 14, 2018

(86) PCT No.: PCT/EP2018/056340
§ 371 (c)(1),
(2) Date: Sep. 20, 2019

(87) PCT Pub. No.: WO2018/172152
PCT Pub. Date: Sep. 27, 2018

(65) Prior Publication Data
US 2020/0161519 A1    May 21, 2020

(30) Foreign Application Priority Data
Mar. 21, 2017   (EP) ..................................... 17161975

(51) Int. Cl.
*H01L 29/18* (2006.01)
*H01L 33/00* (2010.01)
(Continued)

(52) U.S. Cl.
CPC .............. *H01L 33/62* (2013.01); *H01L 23/15* (2013.01); *H01L 23/4006* (2013.01);
(Continued)

(58) Field of Classification Search
CPC combination set(s) only.
See application file for complete search history.

(56) References Cited

U.S. PATENT DOCUMENTS 5,739,800 A * 4/1998 Lebby .................. H01L 25/167
                                                              345/82
9,252,337 B1 * 2/2016 Cumpston .............. H01L 33/20
(Continued)

FOREIGN PATENT DOCUMENTS

WO       2006/105644 A1   10/2006

OTHER PUBLICATIONS

European Search Report dated Oct. 23, 2019 for European Patent Application No. EP 17161975.2.
(Continued)

*Primary Examiner* — Niki H Nguyen
(74) *Attorney, Agent, or Firm* — Volpe Koenig

(57) ABSTRACT

A lighting device and a method of manufacturing a lighting device are described. A lighting device includes a flat carrier that has a front surface and a rear surface opposite the front surface. The flat carrier includes a cutout and multiple carrier-side electrical contacts on the rear surface. A mounting element is provided on the rear surface of the flat carrier and includes multiple mount-side electrical contacts electrically coupled to the multiple carrier-side electrical contacts and an elevated portion projecting into the cutout. Multiple LED elements are provided on the elevated portion of the mounting element and electrically coupled to the mounting element on the same side as the multiple mount-side side electrical contacts. A heat sink element is thermally coupled to the mounting element on a side of said mounting element opposite the flat carrier.

12 Claims, 3 Drawing Sheets

(51) Int. Cl.
  *H01L 33/62* (2010.01)
  *H01L 23/15* (2006.01)
  *H01L 23/40* (2006.01)
  *H01L 23/498* (2006.01)
  *H01L 23/538* (2006.01)
  *H01L 25/075* (2006.01)
  *H01L 33/64* (2010.01)

(52) U.S. Cl.
  CPC .... *H01L 23/49811* (2013.01); *H01L 23/5385* (2013.01); *H01L 25/0753* (2013.01); *H01L 33/641* (2013.01); *H01L 33/642* (2013.01); *H01L 33/644* (2013.01); *H01L 2023/4025* (2013.01); *H01L 2023/4062* (2013.01); *H01L 2023/4087* (2013.01); *H01L 2933/0066* (2013.01); *H01L 2933/0075* (2013.01)

(56) References Cited

U.S. PATENT DOCUMENTS

| | | |
|---|---|---|
| 2005/0237739 A1 | 10/2005 | Lee et al. |
| 2009/0303713 A1 | 12/2009 | Chang et al. |
| 2010/0277666 A1 | 11/2010 | Bertram et al. |
| 2011/0090699 A1* | 4/2011 | Shida ................. F21K 9/233 362/294 |
| 2011/0215354 A1* | 9/2011 | Wang ................. H01L 33/58 257/98 |
| 2014/0091329 A1* | 4/2014 | Lee ................. H01L 33/644 257/88 |
| 2014/0124823 A1 | 5/2014 | Inoguchi |
| 2015/0029725 A1* | 1/2015 | Kamikawa ............. H01L 33/60 362/293 |
| 2016/0165695 A1* | 6/2016 | Gershowitz ............ H05B 45/00 315/297 |

OTHER PUBLICATIONS

International Preliminary Report on Patentability Chapter I dated Sep. 24, 2019 for PCT International Application No. PCT/EP2018/056340.

International Search Report dated May 28, 2018 for PCT International Application No. PCT/EP2018/056340.

* cited by examiner

MOUNTING AN LED ELEMENT ON A FLAT CARRIER

FIELD OF THE INVENTION

The invention relates to a lighting device and a method of manufacturing a lighting device. More particularly, the invention relates to a lighting device mounted on a flat carrier.

BACKGROUND OF THE INVENTION

Flat carriers such as circuit boards are widely used to mount electrical components. By conductor tracks provided on a circuit board interconnecting mounted electrical components, electrical circuits are formed. Circuit boards are generally made of electrically non-conductive material such as fiber reinforced epoxy material. Conductive tracks may be e.g. provided as laminated copper sheets on one side or on both sides of the flat carrier.

LED elements, which are increasingly used for lighting purposes, may be mounted on a circuit board e.g. by SMD solder connection.

Reference US 2011/0 215 354 A1 shows a light-emitting device (LED) package component including an LED chip and a carrier chip. The carrier chip comprises four bond pads on a surface of the carrier chip, wherein the third and fourth bond pad are electrically connected to the first and the second bond pads, respectively. The first, the second, the third, and the fourth bond pad are arranged on a same surface of the carrier chip. The LED package component further includes a first and a second metal bump bonding the first and the second bond pads, respectively, onto the LED chip through flip-chip bonding. Additionally, a window-type module substrate is bonded onto the third and the fourth bond pads through flip-chip bonding. The window-type module substrate includes a window, wherein the LED chip is configured to emit light toward the window. Reference WO 2006/105 644 A1 shows a mounting assembly for one or more light-emitting elements, wherein the mounting assembly is configured such that the one or more light-emitting elements are inferiorly connected to a carrier. The carrier comprises one or more light transmission regions, wherein each of the one or more light-emitting elements is aligned with a light transmission region enabling light to pass through the carrier. The inferior mounting of the light-emitting elements can provide ease of thermal access to a cooling interface associated with the one or more light-emitting elements by a thermal management system.

SUMMARY OF THE INVENTION

It may be considered an object to propose a lighting device and a method of manufacturing thereof which allows to easily mount LED elements on a flat carrier in a way well suited for lighting applications.

The present inventors have considered that LED elements with sufficient operating power to be used in lighting applications require, besides electrical connection, a thermal interface allowing to dissipate heat generated in operation. While this may be addressed by using material with good heat conduction, such as ceramic substrates, as carrier for the LED elements, it would significantly increase cost to provide additional components such as connectors or driver electronics on the expensive ceramic substrate. In particular, cost and size increase for multiple LED elements.

The inventors have recognized that both electrical and thermal connection may be simplified if an LED element is not as usual mounted to face away from the carrier surface it is mounted on, but if the LED element is mounted in reverse fashion.

The lighting device according to the invention includes a flat carrier with opposed front and rear surfaces. In particular, the flat carrier may be a circuit board made out of any material, preferably electrically insulating material, in particular of a plastic material. Electrical contact portions are provided on at least one of the surfaces of the flat carrier, which will be referred to as a rear surface. Each electrical contact portion comprises an element made out of an electrically conductive material, such as a metal, in particular copper. The contact portion provided on the rear surface of the carrier will be further referred to as carrier-side electrical contact portion. In particular, it may be provided as a flat contact pad.

The flat carrier according to the invention comprises a cutout. The cutout is a passage between the front and rear surfaces. The cutout comprises a cutout area which may be bordered e.g. by at least two, preferably three or more, further preferred four or more cutout edges formed by portions of the flat carrier. The edges may preferably be straight. Preferably, the cutout is formed as a hole in the flat carrier, which may be fully enclosed by the carrier material.

Multiple LED elements are provided on a mounting element. The term "LED element" here refers to any kind of solid-state lighting element or elements, such as in particular light emitting diodes, organic light emitting diodes, laser diodes, etc. An LED element may be comprised of a single solid-state lighting element or of a plurality of such solid-state lighting elements arranged closely together.

The mounting element is preferably made of an electrically insulating material, further preferably different from the material of the flat carrier. For example, the mounting element may be made out of a ceramic material, such as in particular AlN. Multiple electrical contact portions, which will be referred to as a mount-side electrical contact portions, are provided on the mounting element and are electrically connected to the LED elements thereon, e.g. by conductors provided on the surface of the mounting element.

According to the invention, the mounting element, or at least a portion thereof, is arranged on the rear surface of the carrier such that an electrical contact is formed between the carrier-side electrical contact portions and the mount-side electrical contact portions. Preferably, the mount-side and carrier-side electrical contact portions are arranged directly on top of each other, either in direct contact or connected by an electrically conductive connection, such as a solder connection.

The mounting element is positioned relative to the carrier such that the LED elements are arranged on or within the cutout, such that light is emitted into the front direction. It is preferred that the mounting element, or at least a portion thereof, is arranged projecting into or covering the cutout, such that the LED element provided thereon is either arranged behind a window defined by the cutout or projects into or even through this window. Thus, a light emitting portion of the LED element may face into the front direction, i.e. opposed to the rear surface on which the mount-side contact element is connected. Thus, the arrangement of the mounting element may be referred to as reverse mounting.

Further, a heat sink element is positioned in thermal contact with the mounting element. The heat sink element is positioned to the rear of the mounting element, such that it may be positioned on or above the rear surface of the carrier.

The heat sink element preferably includes a material of high thermal conductivity, such as a metal, in particular copper.

The proposed lighting device and manufacturing method allow to easily mount an LED element on a flat carrier, such as a circuit board. Conventional positioning and connection techniques available e.g. for SMD components may be used, such as soldering and in particular reflow soldering. A high accuracy of placement may thus be achieved. As will be further explained below, the reverse mounting concept is in particular advantageous for multiple separately operable LED elements, such as a line or array of LED elements. Since the mounting element may be kept small and usual circuit board materials may be used for the carrier, a relatively inexpensive assembly may be formed.

Preferably, the LED elements and the mount-side contact portions are arranged on the same side of the mounting element. Both the mount-side contact portions and the light emitting portion of the LED elements preferably face in the front direction.

According to the invention, the mounting element is provided with multiple LED elements, and multiple mount-side electrical contact portions connected to the LED elements. Corresponding to the mount-side electrical contact portions, multiple carrier-side electrical contact portions are provided on the rear surface of the flat carrier. The mount-side and carrier-side electrical contact portions are then provided in electrical contact with each other, such that an electrical connection to each of the LED elements may be established. Thus, it is possible to provide multiple separately operable LED elements, which may be turned off or on independently of one another, although they may share one common terminal. This concept is applicable to a single LED element, but also e.g. to 2, 3 or more separate LED elements, preferably 5 or more, further preferred 10 or more. The concept may even be used for large numbers of e.g. up to 1000 or up to 500 LED elements, and preferably up to 100 LED elements. In particular for multiple LED elements, the reverse mounted arrangement and electrical contacting via mount-side and carrier-side contact portions allows a very compact structure and easy manufacturing even for a large number of LED elements.

The contact portions may all be provided on the rear surface of the flat carrier on one side of the cutout, e.g. along one edge of the cutout. It is, however, preferred to provide electrical contact portions to more than one side of the cutout, in particular on opposite sides thereof, or surrounding the cutout on all sides. In the preferred embodiment, a first carrier-side electrical contact portion is connected to a first mount-side electrical contact portion and a second carrier-side electrical contact portion is connected to a second mount-side electrical contact portion. The first carrier-side and mount-side electrical contact portions are separated from the second carrier-side and mount-side electrical contact portions by the cutout. This makes efficient use of the available space for the arrangement of the contact portions, in particular for a larger number of LED elements.

In a preferred embodiment, electrical conductor portions may be provided on the rear surface of the carrier, in particular flat conductor tracks. The conductor portions may be connected to the carrier-side contact portion. An electrical circuit may be provided on the rear surface of the carrier, electrically connected to the carrier-side contact portion. The electrical circuit may comprise one or more electrical component and/or one or more electrical plug connector. The components of the circuit may be interconnected by electrical conductor portions. In particular, the electrical circuit may be a driver circuit disposed to provide electrical operating power to the LED element.

The mounting element preferably includes one or more flat mounting portion which may be arranged on the rear surface of the carrier. The mounting element may further comprise at least one elevated portion, which may be arranged to at least partly project into the cutout. The LED element may be arranged on the elevated portion. Depending on the height of the elevated portion, the LED element may be provided within the cutout, or at least substantially level with the front surface of the carrier, or may even project from the front surface.

The heat sink element may preferably be fixed to the carrier, e.g. held by a material connection such as by gluing or soldering, or by a mechanical connection, such as by one or more screws, clamps etc. Fixing the heat sink element to the carrier instead of to the mounting element only provides a large surface for a secure connection.

In a preferred embodiment, the mounting element may comprise a plane rear surface, which may be larger than the cutout. The heat sink element may be provided to cover the rear surface, providing for good thermal contact.

These and other aspects of the invention will be apparent from and elucidated with reference to the embodiments described hereinafter.

DETAILED DESCRIPTION OF EMBODIMENTS

Figure 1:
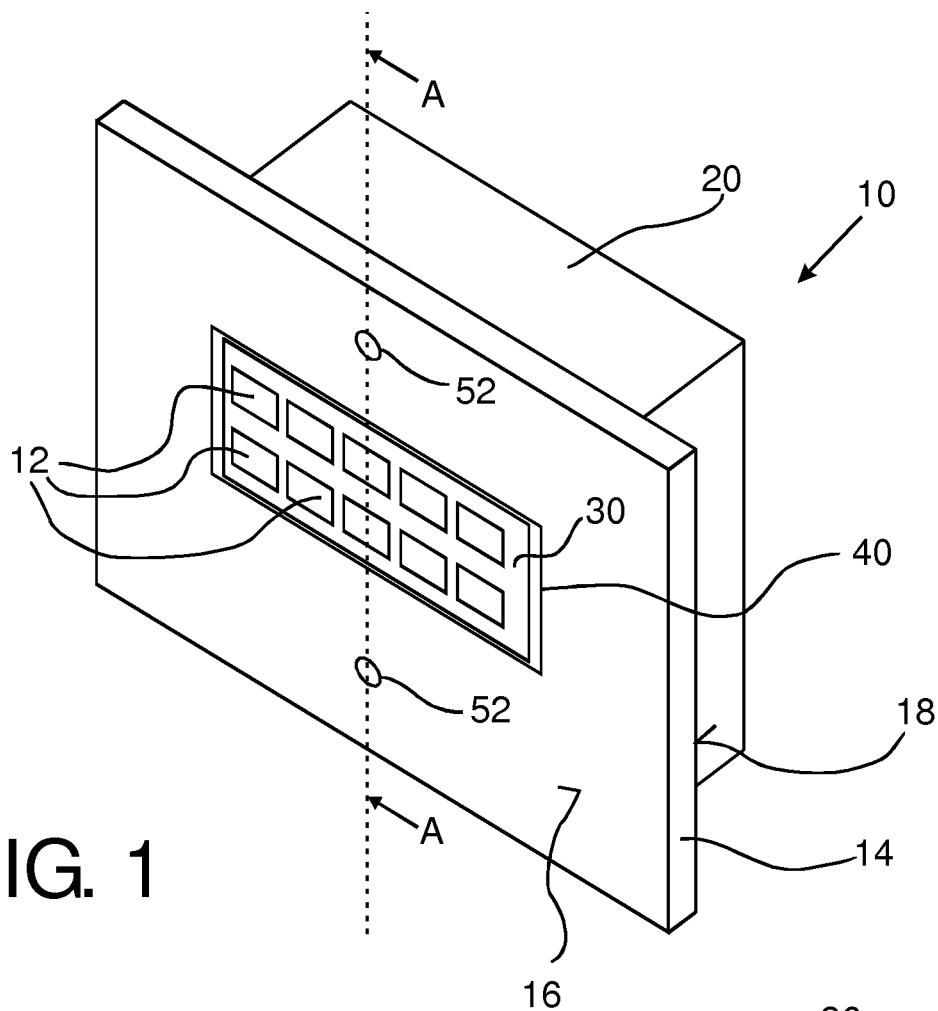
FIG. 1 shows a perspective view of a lighting device according to a first embodiment.

A lighting device 10 shown in FIG. 1 comprises multiple separate LEDs 12 arranged in an array (5×2 in the example shown) mounted on a printed circuit board PCB 14 as a flat carrier.

The PCB 14 has a front surface 16 and a rear surface 18. The flat light emitting surfaces of the LEDs 12 face into the front direction, i.e. outward from the front surface 16.

Figure 2:
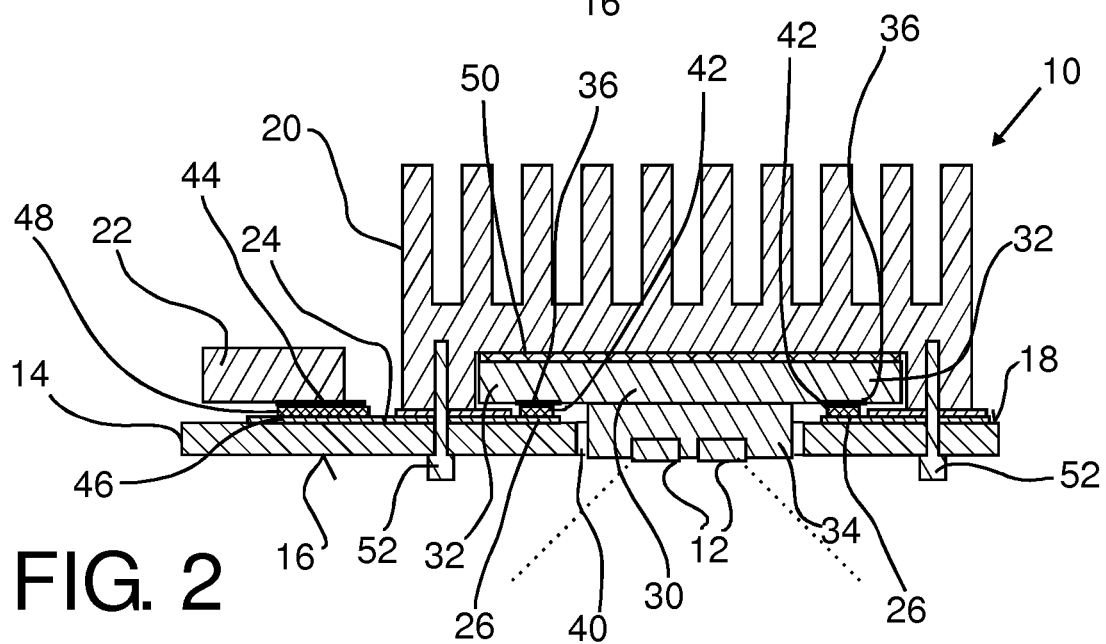
FIG. 2 shows a cross-section of the lighting device of FIG. 1 along A . . . A.

As shown in the cross-sectional view of FIG. 2, an electrical circuit for the LEDs 12 is provided on the rear surface 18 of the PCB 14, including a plug connector 22 (shown schematically only) and conductor tracks (24) provided as a copper layer on the rear surface 18.

The LEDs 12 are mounted on a ceramic (AlN) mounting element 30, which includes peripheral flat mounting portions 32 and a central elevated portion 34 projecting from the flat mounting portions 32 into the front direction. The LEDs 12 are mounted on the elevated portion 34.

A cutout 40 is formed in the PCB 14, connecting the front surface 16 and rear surface 18. In the example shown, the cutout 40 is formed as a rectangular window bordered by four straight edges.

The mounting element 30 is positioned with its mounting portions 32 on top of the rear surface 18 of the PCB 14 such that the central portion 34, which in the example shown is elevated, is arranged within the window formed by the cutout 40. The LEDs 12 are oriented into the front direction, i.e. the light emitting surface is parallel to the front surface 16. Thus, the LEDs 12, if supplied with electrical operating power, emit light into the front direction.

The LEDs 12 are electrically connected to contact pads 36 provided on the mounting portions 32 of the mounting element 30. The contact pads 36 are referred to as mount-side contact portions. They are provided on the same side of the mounting element 30 as the LEDs 12. The electrical connection to the LEDs 12 is provided by flat conductors on the surface of the mounting element 30 (not shown).

In the preferred example, the mounting element 30 is made of AlN as electrically insulating ceramic material with relatively good heat conduction to dissipate heat generated by the LEDs 12 in operation.

The mounting element 30 is positioned on the rear surface 18 of the PCB 14 such that the mount-side contact pads 36 are arranged directly opposed to carrier-side contact pads 26 on the rear surface 18 of the PCB 14. The carrier-side contact pads 26 are electrically connected or formed as parts of the conductor tracks 24 provided on the rear surface 18.

The mount-side contact pads 36 and carrier-side contact pads 26 are arranged on top of each other forming contact pairs. They are electrically connected by solder layers 42 provided in between.

The plug connector 22 also comprises contact pads 44 arranged opposite to contact pads 46 formed as part of the conductor tracks 24 on the rear surface 18 of the PCB 14. Here also, a solder connection 48 is formed.

Thus, the LEDs 12 are electrically connected via the solder connection between the mount-side and carrier-side contact pads 36, 26, the conductor tracks 24, and the solder connection 48 to the plug connector 44. The LEDs may thus be operated by supplying electrical operating power from the plug connector 44 through the described connection path. As each of the LEDs 12 is connected to one of the mount-side contact pads 36 (with a common ground connection), the LEDs 12 are each separately operable. The array of LEDs 12 may e.g. be used in a vehicle headlight as matrix or ADB (adaptive driving beam) light.

Heat generated by the LEDs 12 in operation is dissipated through the thermally conductive mounting element 30 and further through the heat sink 20 mounted to the backside of the mounting element 30 and connected by a heat-conducting layer 50 e.g. of heat conductive paste or glue.

The heat sink 20 is fixed to the PCB 14 by screws 52.

Figure 3A:
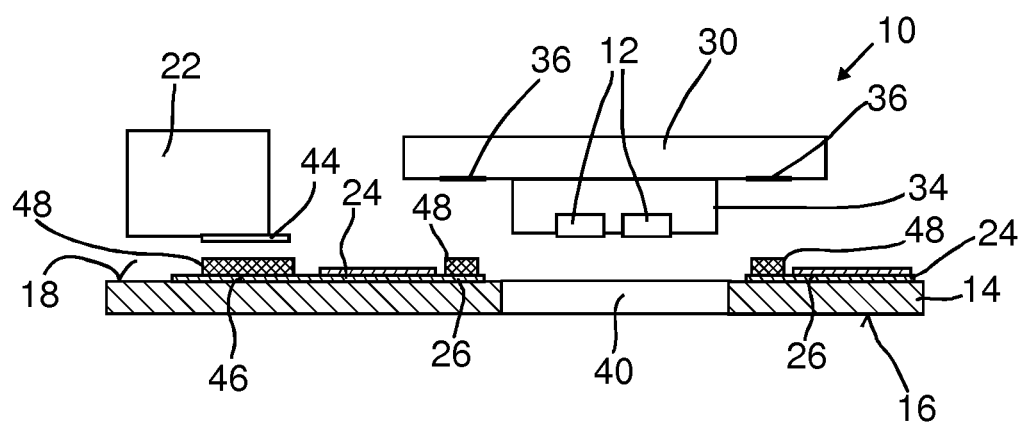
FIG. 3a, 3b show stages of assembly of the lighting device of FIG. 1, FIG. 2.
Figure 3B:
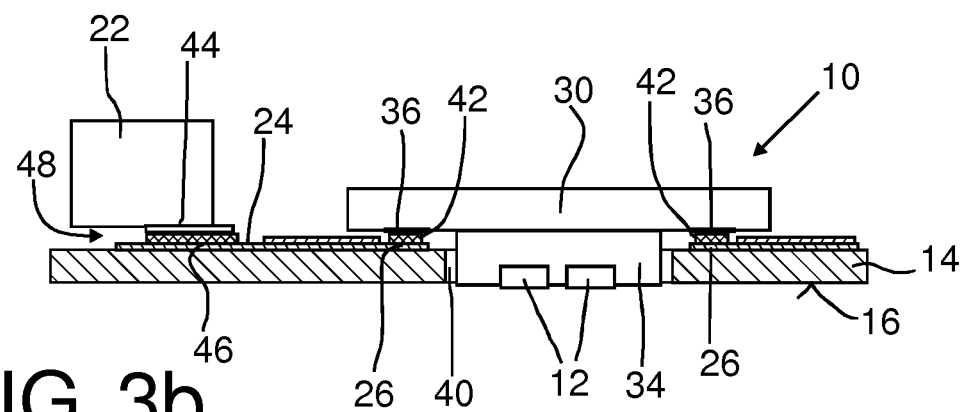

FIG. 3a, 3b show steps of manufacturing the lighting device 10. The PCB 14 is provided with the conductor tracks 24 forming contact pads 26, 46 on the rear surface 18 on both sides of the cutout 40. Solder paste 42, 48 is provided on the contact pads 26, 46. The mounting element 30 is reverse mounted on the rear surface 18 of the PCB 14 with both the LEDs 12 and the mount-side contact pads 36 facing in front direction.

The mounting element is placed onto the rear surface 18 of the PCB 14 such that the mount-side and carrier-side contact pads 26, 36 are placed directly on top of each other, with the solder paste 42 in between. The placement of the mounting element 30 is such that the central portion 34 on which the LEDs 12 are mounted is placed within the window formed by the cutout 40.

The plug connector 22 is also placed on the rear surface 18 of the PCB 14 with the contact pads 44 and 46 facing each other with interposed solder paste 48.

The entire assembly 10 is then subjected to reflow soldering, such that the solder paste 42, 48 melts and provides solder connections between the opposed contact pads 26, 36, 44, 46, thus fixing the mounting element 30 in the reverse mounted position.

In a further step (not shown), the heat sink 20 is placed on the rear surface 18 of the PCB 14 with the interposed layer 50 and fixed by screws 52 such that the back surface of the mounting element 30 is in thermal contact with the heat sink 20.

Figure 4:
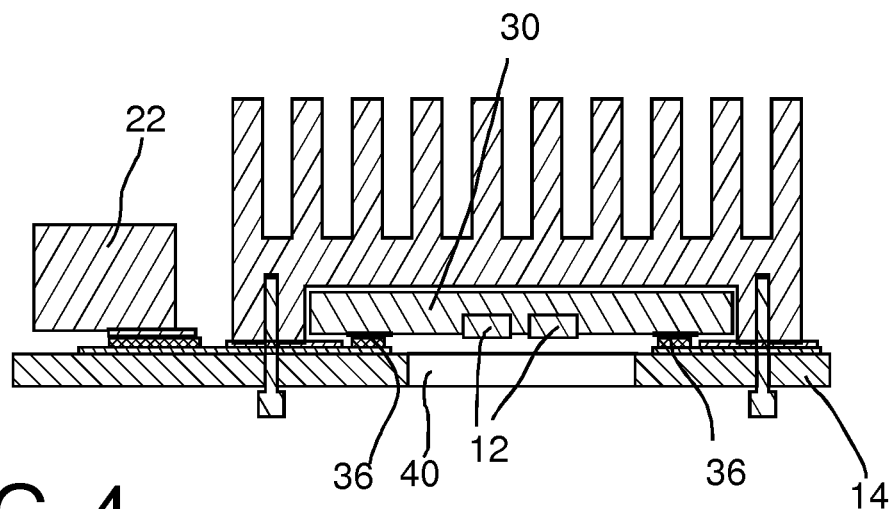
FIG. 4 shows a cross-sectional view of a lighting device according to a second embodiment.

FIG. 4, 5 show alternative second and third embodiments of lighting devices. The second and third embodiment correspond to the lighting device 10 according to the first embodiment. In the following, only differences will be explained. Like reference numerals refer to like parts.

In the second embodiment shown in FIG. 4, the mounting element 30 is entirely flat, i.e. the central portion where the LEDs 12 are mounted is not raised. The LEDs 12 are provided over the cutout 40 to emit light through the window formed by the cutout 40 into the front direction.

Figure 5:
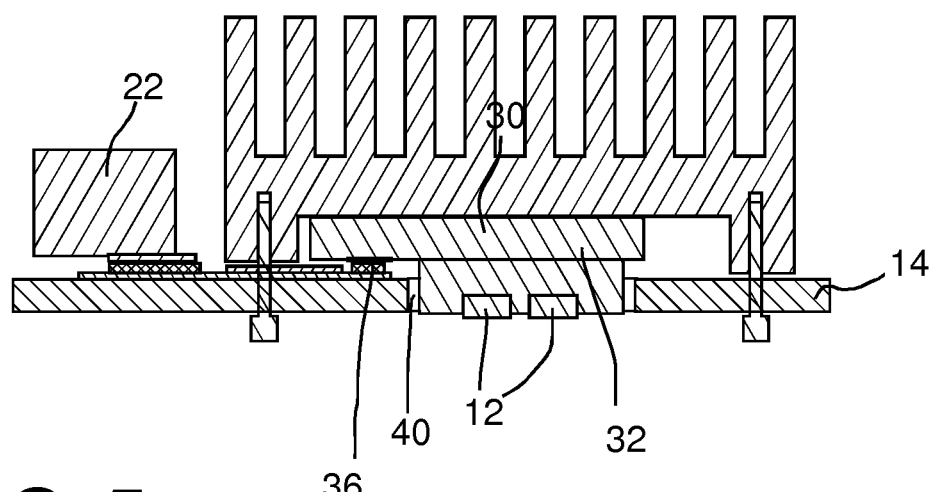
FIG. 5 shows a cross-sectional view of a lighting device according to a third embodiment.

According to the third embodiment shown in FIG. 5, the mounting element 30 is provided with a mounting portion 32 only on one side of the cutout 40, not on both sides as in the first embodiment 10.

While the invention has been illustrated and described in detail in the drawings and forgoing description, such illustration and description are to be considered illustrative or exemplary and not restrictive; the invention is not limited to the disclosed embodiments.

For example, the 5×2 array of LEDs 12 shown in FIG. 1 is only one example of an arrangement of LEDs 12 on the mounting element 30. In different embodiments, lighting devices may comprise more or fewer LEDs, and the LEDs 12 may be arranged differently.

While in the embodiments shown the rear surface 18 of the PCB 14 only comprises an electrical circuit including conductor tracks 24 and the plug connector 22, it is also possible to provide further electrical components forming a different electrical circuit on the PCB 14.

While the cutout 40 in the example shown is a rectangular hole in the PCB 14 entirely bordered on four edges of the PCB 14, the cutout 40 may be shaped differently, and may e.g. be formed at an outer edge of the PCB 14, such that it may not be entirely surrounded by the PCB 14 to all sides.

In alternative embodiments, the mounting element 30 may be made of different material or different materials. In particular, the mounting element may comprise a portion, e.g. a core, made of a material of good heat conduction, e.g. a metal such as Aluminum, Copper or other metals, including alloys containing Copper. If the core is electrically conductive, it may preferably be fully or partially covered by an insulating body or layer, such that the LEDs 12 and/or conductors connecting the LEDs to the mount-side contact pads 36 may be electrically insulated from the core. The insulating body or layer may be designed to still achieve good heat conduction, e.g. by choosing a low thickness and/or an insulating material of good heat conduction, e.g. a ceramic material.

In the claims, any reference signs shall not be construed as limiting the claims. The word "comprising" does not exclude the presence of elements or steps other than those listed in the claims. The indefinite article "a" or "an" preceding an element does not exclude the presence of a plurality of such elements. The mere fact that certain measures are recited in mutually different dependent claims does not indicate that a combination of these measures cannot be used to advantage.

The invention claimed is:

1. A lighting device comprising:
a flat carrier comprising a front surface and a rear surface opposite the front surface, said flat carrier comprising a cutout and multiple carrier-side electrical contacts on the rear surface;
a mounting element on the rear surface of the flat carrier, the mounting element being an insulating body comprising peripheral flat mounting portions and an elevated portion, the elevated portion projecting into the cutout of the flat carrier;
multiple mount-side electrical contacts on a mount-side of the mounting element and electrically coupled to said multiple carrier-side electrical contacts of the flat carrier;
a plurality of LED elements on the elevated portion of the mounting element and electrically coupled to the mounting element on the same side as the multiple mount-side side electrical contacts; and
and a heat sink element thermally coupled to the mounting element on a side of said mounting element opposite the flat carrier.

2. The lighting device according to claim 1, wherein:
the multiple carrier-side electrical contacts comprise at least a first carrier-side electrical contact and a second carrier-side electrical contact,
the multiple mount-side electrical contacts comprise at least a first mount-side electrical contact and a second mount-side electrical contact,
the first carrier-side electrical contact is electrically coupled to the first mount-side electrical contact,
the second carrier-side electrical contact is electrically coupled to the second mount-side electrical contact, and
said first carrier-side electrical contact and said first mount-side electrical contact are separated from said second carrier-side electrical contact and said second mount-side electrical contact.

3. The lighting device according to claim 1, wherein said mounting element is made of a ceramic material.

4. The lighting device according to claim 1, wherein said heat sink is made of a metal material.

5. The lighting device according to claim 1, wherein said flat carrier is made of a plastic material.

6. The lighting device according to claim 1, wherein said mount-side electrical contacts are electrically coupled to said carrier-side electrical contacts by a solder connection.

7. The lighting device according to claim 1, further comprising electrical conductor portions on said rear surface electrically coupled to said carrier-side contacts.

8. The lighting device according to claim 1, further comprising an electrical circuit on said rear surface, electrically connected to said carrier-side contacts, said electrical circuit comprising at least one of an electrical component and an electrical plug connector.

9. The lighting device according to claim 1, wherein said heat sink element is fixed to said carrier.

10. The lighting device according to claim 1, wherein said mounting element comprises a plane rear surface larger than said cutout, and said heat sink element covers said rear surface.

11. A method of manufacturing a lighting device, the method comprising:
providing a flat carrier that comprises a front surface, a rear surface-opposite the front surface, a cutout, and multiple carrier-side electrical contacts on said rear surface;
providing a mounting element, the mounting element being an insulating body comprising peripheral flat mounting portions and an elevated portion, with multiple mount-side electrical contacts electrically coupled to said multiple carrier-side electrical contacts, and a plurality of LED elements on the elevated portion electrically coupled to the mounting element on the same side as the multiple mount-side electrical contacts,
arranging said mounting element on said rear surface of said flat carrier such that said elevated portion projects into said cutout;
forming an electrical contact between said multiple carrier-side electrical contacts and said mount-side electrical contacts.

12. The method according to claim 11, further comprising:
forming a solder connection between said carrier-side electrical contact portions and said mount-side electrical contact portions.

* * * * *